United States Patent [19]
DeWitt et al.

[11] Patent Number: 5,132,685
[45] Date of Patent: Jul. 21, 1992

[54] BUILT-IN SELF TEST FOR ANALOG TO DIGITAL CONVERTERS

[75] Inventors: Michael R. DeWitt, Mohnton; George F. Gross, Jr., Reading; R. Ramachandran, King of Prussia, all of Pa.

[73] Assignee: AT&T Bell Laboratories, Murray Hill, N.J.

[21] Appl. No.: 744,662

[22] Filed: Aug. 9, 1991

Related U.S. Application Data

[63] Continuation of Ser. No. 494,070, Mar. 15, 1990, abandoned.

[51] Int. Cl.$^5$ .................................................. H03M 1/10
[52] U.S. Cl. ..................................... 341/120; 324/73.1
[58] Field of Search ............... 324/73.1; 341/120, 121, 341/155, 163, 164

[56] References Cited

U.S. PATENT DOCUMENTS

| | | | |
|---|---|---|---|
| 3,603,772 | 9/1971 | Paine et al. | 341/120 X |
| 3,816,813 | 6/1974 | Jehu | 341/120 X |
| 4,352,160 | 9/1982 | Frech et al. | 341/120 X |
| 4,354,177 | 10/1982 | Sloane | 341/120 |
| 4,539,683 | 9/1985 | Hahn et al. | 341/120 X |
| 4,827,259 | 5/1989 | Murphy et al. | 341/164 X |
| 4,872,168 | 10/1989 | Aadsen et al. | 371/21 |
| 4,897,650 | 1/1990 | Shott, III et al. | 341/164 X |
| 4,908,621 | 3/1990 | Polonio et al. | 341/120 |
| 4,947,106 | 8/1990 | Chism | 341/120 X |

FOREIGN PATENT DOCUMENTS

| | | | |
|---|---|---|---|
| 247334 | 7/1987 | German Democratic Rep. | 341/120 |
| 247384 | 7/1987 | German Democratic Rep. | 341/120 |
| 61-137429 | 6/1986 | Japan | 341/120 |

OTHER PUBLICATIONS

The Engineering Staff of Analog Devices, Inc., "Analog-Digital Conversion Handbook", Third Edition, copyright 1986, pp. 134–140, 173–176, 356–359.
IBM Technical Disclosure Bulletin, vol. 22 No. 3 Aug. 1979, D. Sellier "Analog to Digital Converter Automatic Tester".
Havener, "Catch Missing Codes," Electronic Design vol. 16 2 Aug. 1975, pp. 58–64.
A Simple Des. Mthod. for Test. Flash A/D Converter Output Encoding Marc L. Simpson et al., IEEE Transactions on Instrumentation and Measurement, vol. 37, No. 4, Dec. 1988.

*Primary Examiner*—Howard L. Williams
*Attorney, Agent, or Firm*—James H. Fox

[57] ABSTRACT

An integrated circuit having an analog-to-digital converter includes built-in self-test (BIST) circuitry. The BIST circuitry checks for monotonicity, and typically also that all possible codes are present, by applying a ramp voltage to the A/D input, while a state machine monitors the output. The state machine can check to ensure that the output increases by only one least significant bit (LSB) each time the output changes. A counter may be checked at the end of the test, to ensure that all the possible codes are obtained. The BIST circuitry may be activated, and the results monitored, through package terminals after the chip is packaged, thereby allowing for boundary scan testing. The inventive technique may be used to save testing costs during manufacture. In addition, system diagnostics in the field can become more cost effective.

8 Claims, 5 Drawing Sheets

BUILT-IN SELF TEST FOR ANALOG TO DIGITAL CONVERTERS

This application is a continuation of application Ser. No. 494,070, filed on Mar. 15, 1990, now abandoned.

BACKGROUND OF THE INVENTION

1. Field of the Invention

This invention relates to a technique for performing a self-test on integrated circuits that include an analog to digital converter.

2. Description of the Prior Art

The testing of integrated circuits that include analog to digital converters typically involves supplying an analog test signal from an external source, and monitoring the digital outputs. The test signal is typically a ramp voltage, and the digital output codes may be stored in a cache memory for later analysis. This analysis usually checks to determine that all the desired digital codes are produced, and that the codes increase monotonically. Checks for linearity are also included in some cases. For example, one type of all codes test uses an off-chip "match register" that is loaded sequentially with all possible codes. A ramp voltage is supplied to the analog input, and the match register is monitored by software to ensure that all the codes are achieved by the end of the ramp. Otherwise, a time-out signal causes a failure to be indicated. However, the conventional testing techniques not only require a significant amount of test equipment, but also may require probing a wafer with a multiplicity of probes to gain access to the various signal points of a given integrated circuit.

The subject of built-in self test (BIST) for integrated circuits has received considerable attention in recent years. The BIST concept generally provides for including in an integrated circuit at least some of the circuitry required to perform tests to ensure its proper operation. For example, the test signals may be generated on-chip, and some or all of the circuitry required to analyze the results may be integrated into the chip under test. The goal is typically to simplify testing during manufacture, by reducing the number of test signals that must be supplied to the IC, and the amount of test equipment required to analyze the results. In addition, system diagnostic tests in the field after manufacture are much easier to accomplish, and even real-time failure diagnostics may be performed.

The output of a BIST circuit may, if desired, be a simple flag set to indicate either a pass or fail condition for the IC, or a portion thereof. For example, a technique to test IC memory arrays is described in U.S. Pat. No. 4,872,168 coassigned herewith. If desired, the output pass/fail flag may be provided to the IC package terminals according to the Joint Test Action Group specifications, (IEEE Stantard 1149.1) in order to implement boundary level scanning techniques. That is, each integrated circuit on a board may be queried to perform a self-test cycle, whereby all of the circuitry on the board may be tested. FIG. 4 illustrates one possible configuration to test a multiplicity of such IC's on a circuit board using the JTAG Test Access Port (TAP). In FIG. 4, TCK, TMS, TDI, and TDO denote the test clock, test select, test data-in and test data-out signals on the TAP, respectively. Input pin TMS is used to activate the self-test on integrated circuits IC1-IC4. The test clock and the test data are applied through the input pins TCK and TDI, respectively. The test outcome is stored in a register on the circuit board and is scanned out through the output pin TDO.

However, while BIST techniques for digital circuits are becoming well established, there has been comparatively very little BIST development for the analog portions of circuits that include both analog and digital circuitry. Such mixed-signal integrated circuits often contain hidden nodes that are difficult to observe and test. Since it is the nature of analog circuits to be susceptible to drift and other variances, the need for BIST for operational checks in analog circuits is perhaps even greater than for digital circuits. For example, in telephonic systems, avionics, machine controllers, process controllers, and automotive systems, to name only a few, it is common to perform analog-to-digital (A/D) conversion. It is essential to ensure the accuracy of the A/D conversion, to help ensure the accuracy of other operations that are subsequently performed digitally. Therefore, there is a significant need to provide BIST techniques for integrated circuits that include analog-to-digital converters.

SUMMARY OF THE INVENTION

We have invented a built-in self test technique for an integrated circuit having an analog to digital converter. A linear ramp voltage is generated on the integrated circuit and applied to the input of the A/D converter during a test. A circuit may be included to determine the monotonicity of the A/D converter, typically by determining if the output code changes by only one least significant bit each time the output changes. A circuit may be included to determine whether all the digital codes in the range of the A/D converter are generated. Still other checks may optionally be performed. For example, determining the number of conversions per code gives an indication of the linearity of the A/D converter.

DETAILED DESCRIPTION

The following detailed description relates to a built-in self test (BIST) technique for integrated circuits that include an analog to digital (A/D) converter. An illustrative embodiment shows its application to a 4 bit A/D converter, but with application to converters of any size being possible, and included herein.

Figure 1:
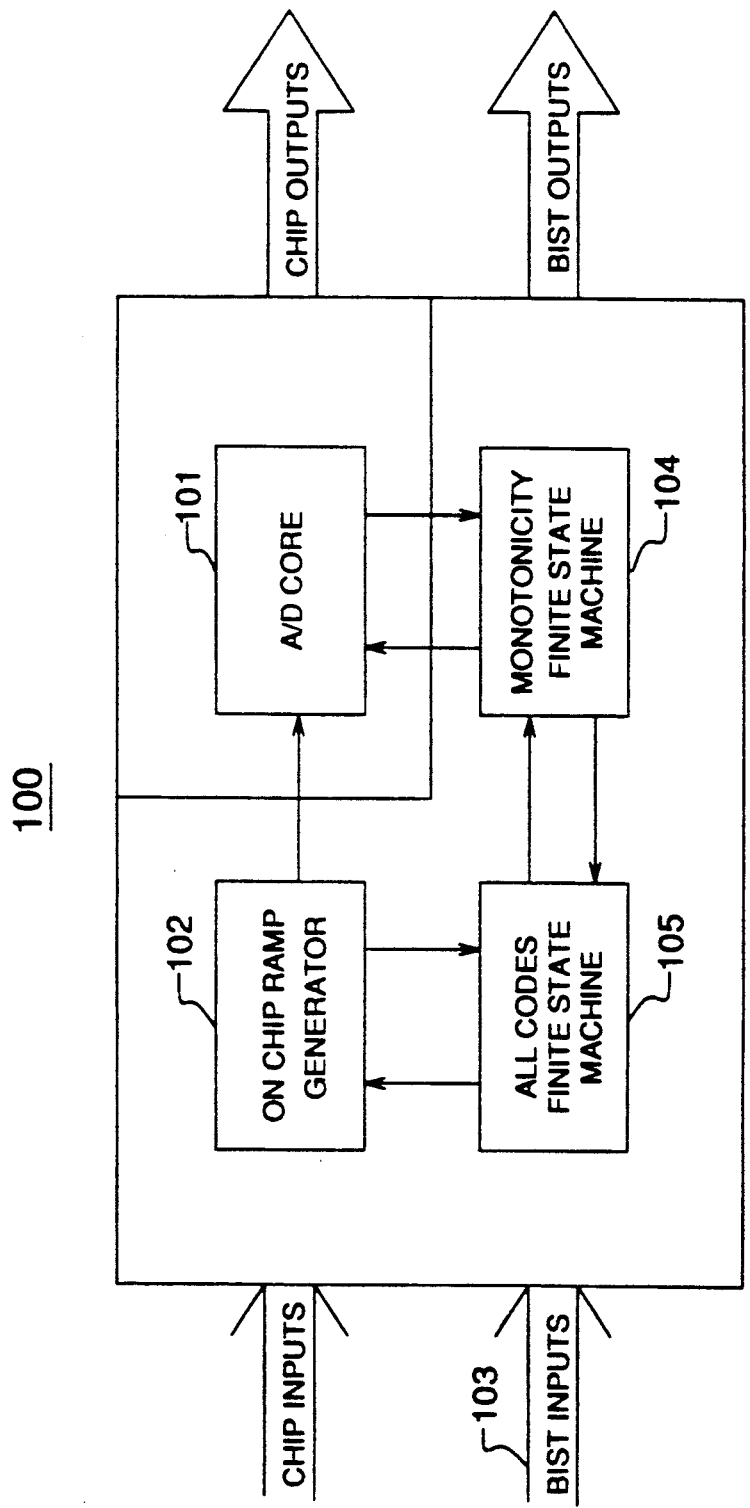
FIG. 1 shows a block diagram of an embodiment of the present invention.

Referring to FIG. 1, an integrated circuit (100) includes an A/D converter (101). The converter may be of any type, including, for example, a successive approximation converter, or a flash converter. A ramp generator (102) is activated when a control signal is applied. The control signal is typically supplied from an input (103) of the integrated circuit, but may be generated in other manners. The ramp generator produces a ramp voltage $V_R$ that is supplied to the input of the A/D converter. Various techniques are known in the art to generate a ramp voltage. For example, one technique that produces a highly linear ramp voltage is to include a precision-ratio charge-redistribution capacitor array digital to analog converter (DAC) on the integrated circuit. The binary inputs to this DAC are monotonically sequenced from 0 to $2^n - 1$. This sequencing is synchronized to the A/D conversion cycles.

If the A/D converter is of the successive-approximation type, it already contains the above-noted precision DAC as part of its structure. In that case, the DAC can assume two different modes, "A" and "B". In mode A, the DAC is used to produce one of the $2^n$ possible DC voltages. This voltage is then sampled and held. The DAC is then switched to mode B, its normal mode, and the sampled-and-held DC voltage is then converted by the A/D converter. Additionally, the resolution of the DC voltage generated in mode A can be improved by configuring the DAC to produce $\frac{1}{2}$, $\frac{1}{4}$, $\frac{1}{8}$, etc. least significant bit (LSB) steps, thereby providing $2^{n+1}$, $2^{n+2}$, $2^{n+3}$, etc. discrete input voltage stimuli to the A/D converter under test.

An alternative technique is to provide a simple switched-capacitor charge pump. In that case, a small on-chip capacitor is charged to a fixed reference voltage. This charge is then switched to a larger off-chip holding capacitor in increments during each A/D conversion cycle. This switching is synchronized to the A/D conversion cycles. Therefore, with each successive conversion cycle, additional charge is accumulated on the off-chip capacitor. The resultant voltage on the off-chip capacitor will therefore increase with time at a rate governed by the ratio of the on-chip capacitor value to the off-chip capacitor value. Still other ramp generation techniques are possible. Although a highly linear ramp voltage is not necessary for all the tests described herein, the ramp voltage should be monotonic; that is, continually increasing in time in the illustrative embodiment. It is to be understood that a monotonically decreasing ramp voltage may equivalently be used, which reverses the sequence in which the digital output codes are generated from that shown herein.

Also included on the integrated circuit is the BIST logic circuitry, which includes in the illustrative case a "Monotonicity Finite State Machine" (104), and an "All Codes Finite State Machine" (105). As will be understood by workers in the art, a finite state machine (FSM) is circuitry that produces an output that depends on both the present and previous values of its input. The functions of these circuits will be more fully explained below.

Figure 2:
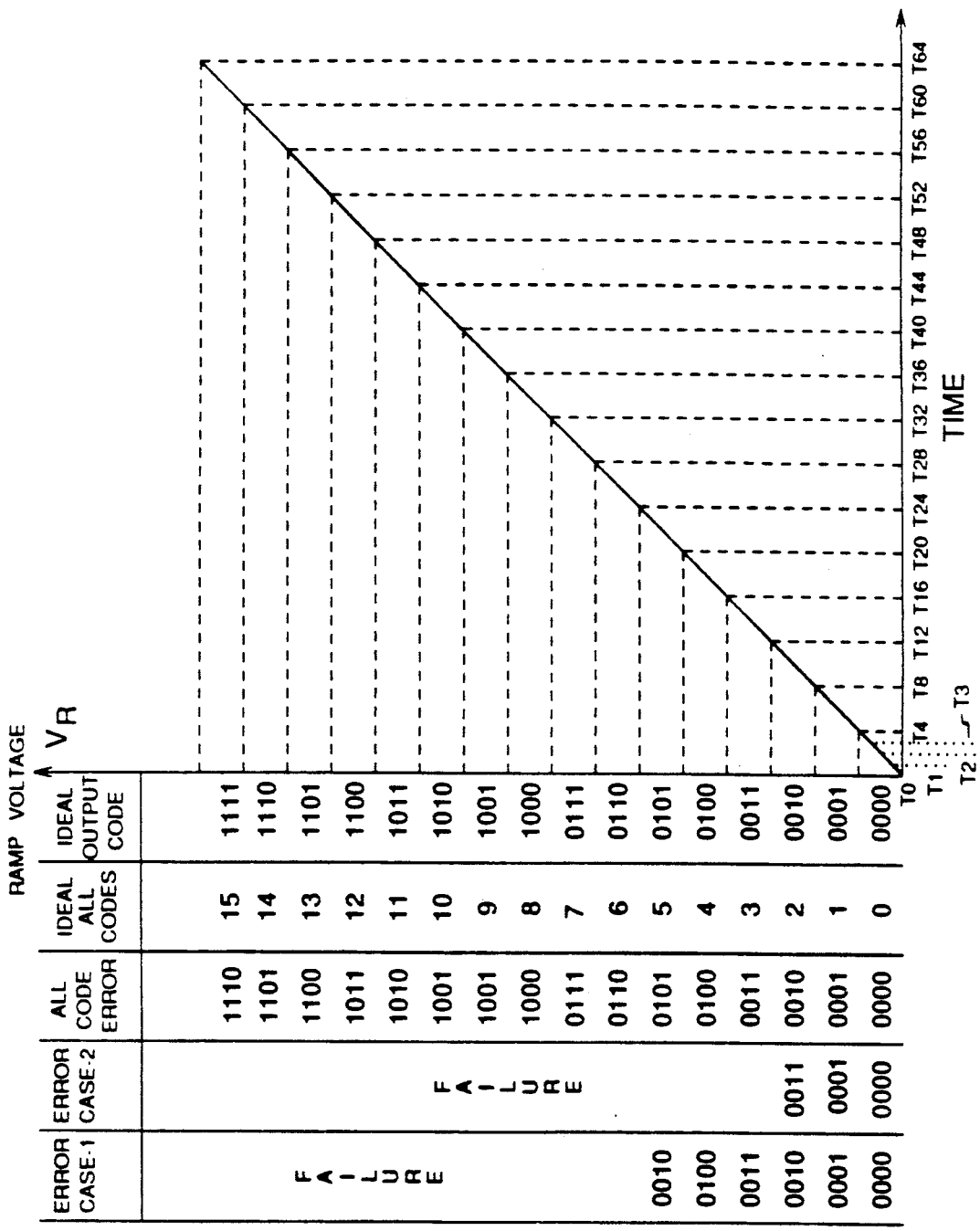
FIG. 2 shows exemplary digital output codes of an A/D converter with a linear ramp voltage applied to its analog input.

Referring to FIG. 2, exemplary test cycles are shown. The output codes are shown as a function of the input voltage, which is the linear ramp voltage $V_R$ produced during the test. The input voltage is sampled and converted at time intervals T0 . . . T64 in the exemplary case, as determined by a clock. The test begins at T0, when the FSM circuitry is initialized, and ends at T64, when the outputs of the FSM's are examined. A complete set of samples from times T0 to T4 are shown, with other sample points being omitted from FIG. 2 for clarity. The "ideal" output codes are shown in FIG. 2 as ranging from 0000 to 1111, being the binary representation of the range from 0 to 15. That is, $2^n = 16$ binary output codes are produced for an n-bit converter, wherein n=4 in the exemplary 4-bit case. Note that in the ideal case shown, the output code increases by one LSB each time the output code changes. Since the output code only increases (with no decreases) as a function of the input voltage, the output code may be said to be monotonically increasing, or simply "monotonic" as used herein.

In FIG. 2, two illustrative cases of non-monotonic A/D converters undergoing the built-in test cycle are also shown. For Error Case 1, the output code increases monotonically from 0000 to 0100 for the conversion of samples T0 to T16. However, the output code then decreases, back to 0010, by the time of sample T20. This is a decrease of two LSB's, and is considered an error. In Error Case 2, an error occurs when the output code jumps from 0001 to 0011, an increase of two LSB's, between samples T4 and T8. The present invention provides that a change (either increase or decrease) of two or more LSB's between successive codes produces an error indication from the Monotonicity FSM. In other words, a change of greater than one LSB produces this error. When a failure of the monotonicity test occurs, the test cycle may be terminated, in order to save testing time.

In implementing the monotonicity test criteria, it is typically desirable to allow for a decrease of one LSB between successive output codes, to allow for jitter in the A/D converter resulting from quantization noise. Therefore, in a presently preferred embodiment, the output codes are considered monotonic if: (1) they do not decrease by more than one LSB from any given code during all succeeding conversions; and (2) they do not change (increase or decrease) by more than one LSB from one code to the next. These criteria are more clearly illustrated in FIG. 3, which shows an algorithm that may be implemented with the "Monotonicity FSM". Note that these criteria assume an increasing ramp input voltage. In the case of a decreasing input voltage, the criterion (1) is that the codes do not increase by more than one LSB from any given code during all succeeding conversions. In general, the criterion (1) may simply be stated that the codes do not revert by more than one LSB from any given code to a previous code.

Figure 3:
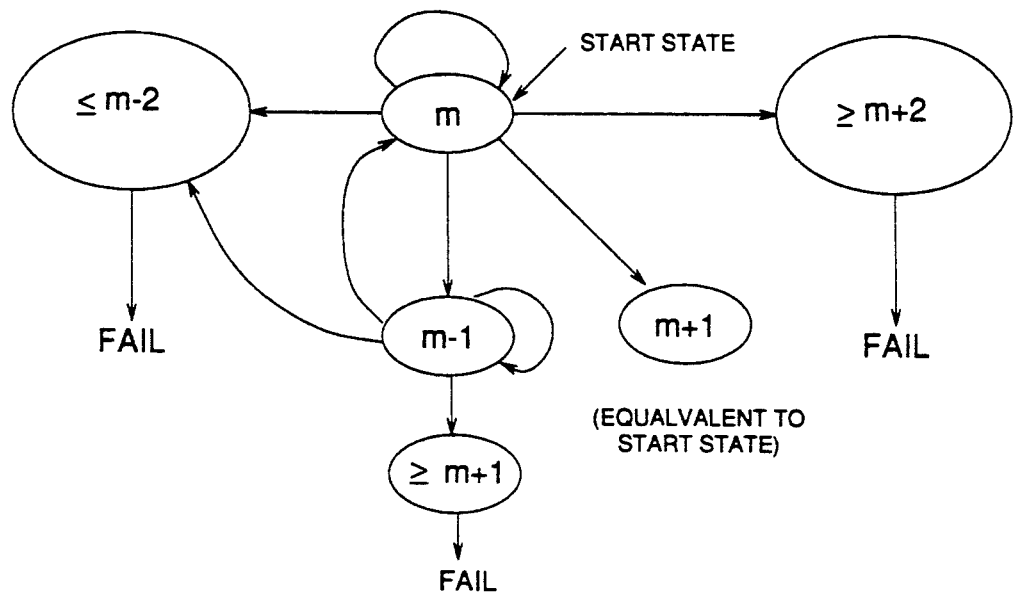
FIG. 3 shows an algorithm that may be used for determining monotonicity.
Figure 5:
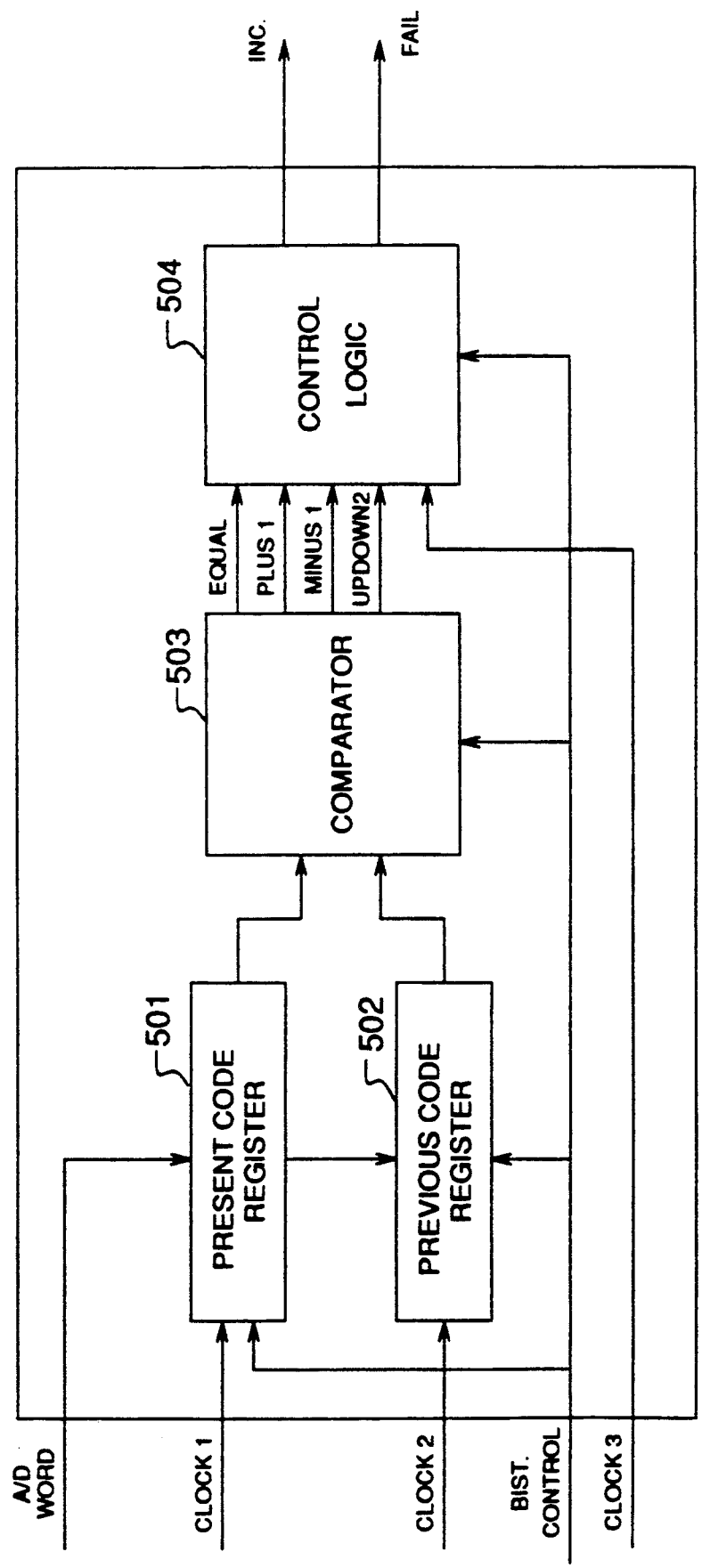
FIG. 5 shows a block diagram of the Monotonicity FSM.

The criteria shown in FIG. 3 may be implemented by a finite state machine as shown in FIG. 5. The signals Clock 1-Clock 3, BIST Control, and A/D Word are provided to the inputs shown. The outputs INC and FAIL provide for control to the All Codes FSM, and error indication, respectively. In the illustrative implementation, the present and the immediately preceding output code words are stored in the Present Code Register (501), and the Previous Code Register (502), respectively; their running difference is evaluated by a Comparator (503) at the end of each A/D conversion cycle. Thus, each time a new code is received, the Comparator asserts (e.g., places at logic high) one of the four outputs: EQUAL, PLUS1, MINUS1, or UPDOWN2. In turn, these outputs drive the Control Logic (504) to produce the INC and FAIL outputs. When successive A/D code words conform to the monotonicity criteria, the INC output is asserted. Otherwise, the FAIL output is asserted to provide for an error indication.

Other criteria may be provided in addition to, or in lieu of, those implemented in FIG. 3. For example, it may be desirable to place a limit on how many times the code can jump back and forth between one code and the adjacent lower code, since it is unlikely that jitter due to quantization noise will cause that to happen more than once per code. However, this additional criterion has not at present been found necessary to provide for a very reliable test, and its omission simplifies the implementation of the test.

Referring again to FIG. 2, an example of the "all codes" test is also given. Note that the output of the "ideal All Codes" FSM ranges from 0 to 15 (in decimal representation). The All Codes FSM circuit is initialized at 0 at the beginning of a test. The output increases by one LSB each time a new output code occurs that is different from any of the previous output codes produced during that test. Therefore, if all 15 of the output codes are produced, then the All Codes FSM produces an output value of 15 at the end of the test. However, if any of the output codes are not produced during a test, then the All Codes FSM will have an output that is less than 15 at the end of the test, which condition produces an error indication. For example, the "all code error" column in FIG. 2 illustrates the case wherein the output code does not reach the final value of 1111. This is due to an error around the value of 1001, wherein the output code does not increase over the range of conversions of samples T36 through T40. Therefore, the All Codes FSM would count to only 14 in the illustrative error case.

Figure 6:
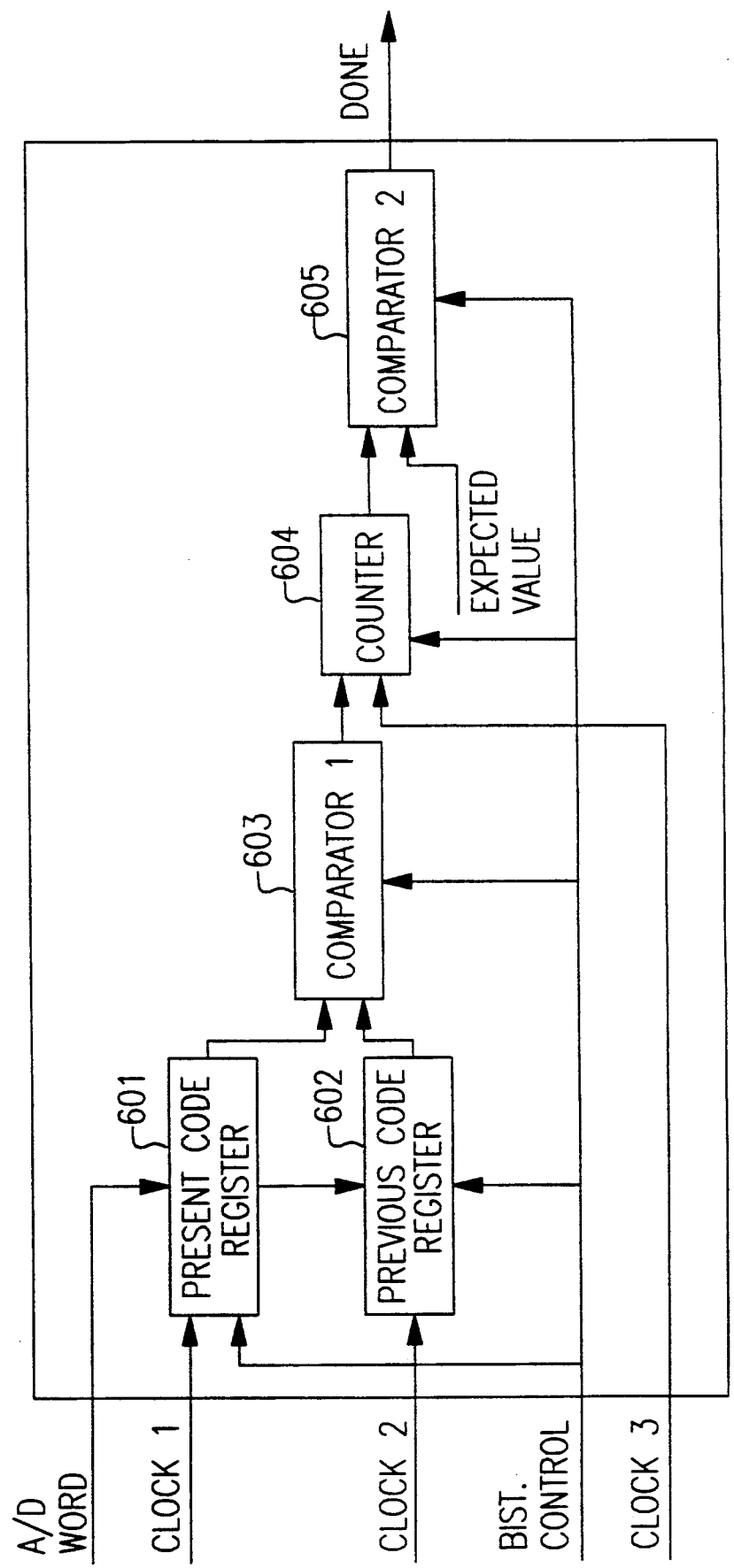
FIG. 6 shows a block diagram of the All Codes FSM.

FIG. 6 shows an implementation of the All Codes FSM, which is coupled to the Monotonicity FSM, and the on-chip ramp generator (FIG. 1). The signals "Clock 1"–"Clock 3" provide the timing inputs, which are typically derived from an on-chip clock generator. The "BIST Control" provides the test activation input, and "A/D Word" provides the data input, being an output code word from the A/D converter under test. The present and the immediately preceding output code words are stored in the Present Code Register (601) and the Previous Code Register (602), respectively; their running difference is evaluated by the Comparator 1 (603) at the end of each A/D conversion cycle. Thus, each time a new code word is received, Comparator 1 evaluates this difference and instructs the Counter (604) to increment by one unit if the difference is +1, or freeze its count if the difference is 0 or −1. In all other cases, an error is immediately indicated and the test cycle is terminated. If not thus terminated, the comparison continues until the end of a test cycle, as signified by the end of the ramp signal $V_R$ in FIG. 2. The output of the Counter is compared with the Expected Value by Comparator 2 (605). The DONE signal is asserted (high) if the Counter reaches its maximum count by the time the ramp signal $V_R$ reaches its maximum value (FIG. 2). If DONE is not asserted by that time, then an error indication is made by a logical combination of the DONE signal and the end of the ramp $V_R$ signal. The Expected Value is 15 (binary 1111) in the illustrative case, and hence an error signal is generated if that value is not produced by the Counter.

Still other tests may optionally be implemented. For example, a "Linearity" test may be conveniently implemented by counting the number of conversions per output code. The average number of conversions per code can be determined from the total number of conversions on all codes in the range of the A/D converter. "Differential linearity" on a specific code is given by the ratio of the number of conversions obtained on that code to the average number of conversions. "Integral linearity" can be defined as the running sum of the individual differential linearities from code 0 through code $2^n-1$ for an n-bit A/D converter. These definitions of linearity are based on end-point sampling of codes, However, it is alternatively possible to define these measures of linearity based upon the mid-point sampling of codes. Based upon these or other definitions of linearity, criteria can be established to provide a pass or fail indication of the linearity test.

Figure 4:
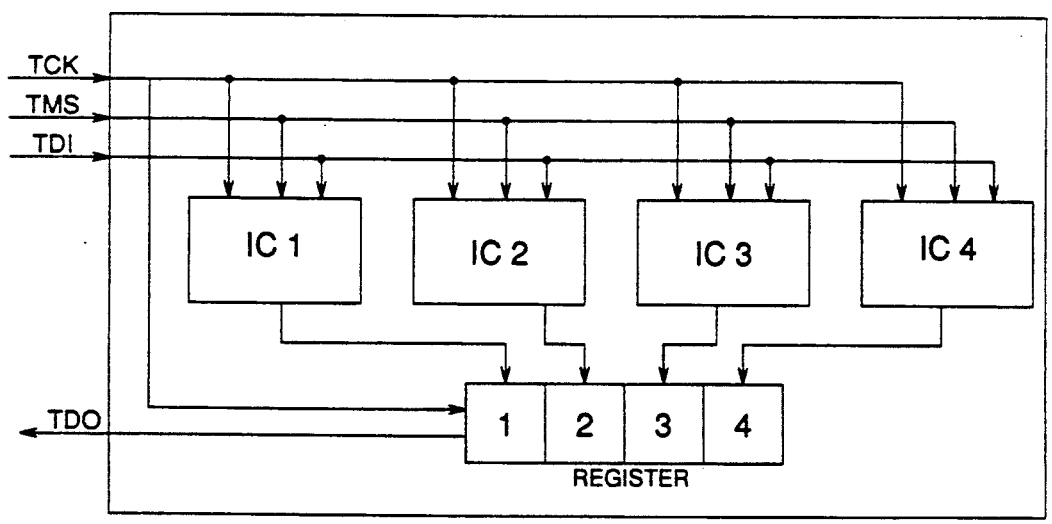
FIG. 4 shows boundary scan testing of IC's on a circuit board.

The output of the various tests may be supplied individually to other portions of the integrated circuit, or may be supplied externally to the integrated circuit. For example, if supplied internally, a redundancy technique may be implemented wherein a second A/D converter on the same integrated circuit substitutes for one that failed one or more of the tests. This can provide, for example, for implementation of wafer scale integration using a multiplicity of A/D converters, allowing for an increase in yield of usable wafers. In another example, it can provide for very high reliability integrated circuits that can repair themselves in operation. If the results of the tests are to be supplied externally, for example for boundary scan testing (e.g., FIG. 4), they are typically combined into a single pass/fail flag. That is, the output of the All Codes FSM and the Monotonicity FSM may be logically combined (e.g., with an OR gate), so that if either test is failed, then the BIST output flag is set to a logic value indicating a "fail", and is otherwise set to the opposite logic value indicating a "pass". The BIST output flag may be supplied to a separate integrated circuit terminal devoted to this purpose; alternatively, it may be multiplexed onto a terminal that also serves other purposes. Still other uses of the test results are possible, and included herein.

We claim:

1. An integrated circuit including an analog to digital converter that converts an analog signal into an n-bit digital output code,
   characterized in that said integrated circuit further includes self-test means comprising:
   means for providing a monotonic ramp voltage input signal during a test; and
   finite state means for determining whether successive digital output codes differ from the previous value by less than a specified amount during said test, wherein said finite state means comprises:
   a present code register for storing a given n-bit output code;
   a previous code register for storing the n-bit output code previous to said given output code; and
   first comparator means for comparing the contents of the present and previous code registers in order to determine whether a code immediately following any given code differs from the given code by more than one least significant bit, in which case a fail signal is generated, wherein said finite state means further determines whether any given code reverts one least significant bit to a previous code in each of two conversions immediately following the given code, in which case a fail signal is generated.

2. The integrated circuit of claim 1 wherein said self-test means further comprises all code means for determining whether all $2^n$ digital output codes are produced by said converter during said test, wherein said all code means comprises:
   a counter means that is incremented by said first comparator means when the difference between the contents of said present code register and said previous code register is one least significant bit having a given sign; and a second comparator means for comparing the contents of said counter with an expected count.

3. The integrated circuit of claim 1 wherein said self-test means further comprises linearity means for counting the number of conversions for each of the codes, and providing a fail signal when the number of conversions for at least one code is outside of a desired limit.

4. The integrated circuit of claim 1 wherein said fail signal terminates said test.

5. An electronic system comprising a multiplicity of integrated circuits at least a given one of which has test means for performing a built-in self-test, wherein said system includes means for activating said test means, and further includes means for receiving the test results produced by said test means, with the given integrated circuit including an analog to digital converter that converts an analog signal into an n-bit digital output code, characterized in that said test means comprises:

means for providing a monotonic ramp voltage input signal to said analog to digital converter during a test;

and finite state means for determining whether successive digital output codes from said analog to digital converter differ from the previous value by less than a specified amount during said test, wherein said finit state means comprises:

a present code register for storing a given n-bit output code;

a previous code register for storing the n-bit output code previous to said given output code; and first comparator means for comparing the contents of the present and previous code registers in order to determine whether a code immediately following any given code differs from the given code by more than one least significant bit, in which case a fail signal is generated, wherein said finite state means further determines whether any given output code reverts one least significant bit to a previous code in each of two conversions immediately following the given code, in which case a fail signal is generated.

6. The electronic system of claim 5 wherein said test means further comprises all code means for determining whether all $2^n$ digital output codes are produced by said converter during said test, wherein said all code means comprises:

a counter means that is incremented by said first comparator means when the difference between the contents of said present code register and said previous code register is one least significant bit having a given sign; and a second comparator means for comparing the contents of said counter with an expected count.

7. The electronic system of claim 5 wherein said test means further comprises linearity means for counting the number of conversions for each of the codes, and providing a fail signal when the number of conversions for at least one code is outside of a desired limit.

8. The electronic system of claim 5 wherein said fail signal terminates said test.

* * * * *